US012772768B2

(12) United States Patent
Muraki

(10) Patent No.: US 12,772,768 B2

(45) Date of Patent: Oct. 20, 2026

(54) SEMICONDUCTOR MANUFACTURING APPARATUS AND METHOD OF PROCESSING OBJECT

(71) Applicant: Kioxia Corporation, Tokyo (JP)

(72) Inventor: Shinsuke Muraki, Kuwana (JP)

(73) Assignee: Kioxia Corporation, Tokyo (JP)

( * ) Notice: Subject to any disclaimer, the term of this patent is extended or adjusted under 35 U.S.C. 154(b) by 1157 days.

(21) Appl. No.: 17/652,986

(22) Filed: Mar. 1, 2022

(65) Prior Publication Data

US 2023/0092336 A1 Mar. 23, 2023

(30) Foreign Application Priority Data

Sep. 17, 2021 (JP) ................................. 2021-152172

(51) Int. Cl.

*H10P 50/64* (2026.01)
*H10P 72/00* (2026.01)
*H10P 72/72* (2026.01)
*H10P 72/76* (2026.01)
*H10P 72/78* (2026.01)

(52) U.S. Cl.

CPC ........ *H10P 50/642* (2026.01); *H10P 72/0422* (2026.01); *H10P 72/72* (2026.01); *H10P 72/78* (2026.01)

(58) Field of Classification Search

None

See application file for complete search history.

(56) References Cited

U.S. PATENT DOCUMENTS 5,324,012 A * 6/1994 Aoyama ............. H01L 21/6838 269/21
7,425,238 B2 * 9/2008 Muto .................... B25B 11/005 269/21
8,075,730 B2 * 12/2011 Shimura ........... H01L 21/31138 156/345.31

(Continued)

FOREIGN PATENT DOCUMENTS

JP 58115833 A * 7/1983 ........... H01L 21/302
JP 62-79647 A 4/1987

(Continued)

OTHER PUBLICATIONS

Machine Generated English Translaton of the Description of JP58115833A. Published Jul. 9, 1983 (Year: 1983).*

*Primary Examiner* — Sylvia Macarthur

(74) *Attorney, Agent, or Firm* — Oblon, McClelland, Maier & Neustadt, L.L.P.

(57) ABSTRACT

A semiconductor manufacturing apparatus for processing an object having a first surface and a second surface opposite to the first surface, includes: a first processor having a chuck in a first chamber, the chuck having a chuck surface configured to chuck the object, the chuck surface having protrusions adjacent to each other along one direction of the chuck surface, the protrusions being configured to be pressed against the second surface to form depressions adjacent to each other along one direction on the second surface; and a second processor configured to expose the second surface to a chemical solution in a second chamber to process the depressions into a trench, the trench extending along the one direction on the second surface.

16 Claims, 11 Drawing Sheets

(56) References Cited

U.S. PATENT DOCUMENTS

| | | | | |
|---|---|---|---|---|
| 8,705,008 | B2 * | 4/2014 | Shibazaki | G03F 7/70866 355/72 |
| 9,177,846 | B2 * | 11/2015 | Kawamura | H01L 21/68742 |
| 11,081,322 | B2 * | 8/2021 | Noro | C23C 16/505 |
| 2004/0036850 | A1 * | 2/2004 | Tsukamoto | G03F 7/707 355/75 |
| 2015/0311108 | A1 * | 10/2015 | Horiuchi | H10P 72/7616 269/302 |
| 2017/0345701 | A1 * | 11/2017 | Ishino | H10P 72/78 |
| 2017/0345702 | A1 * | 11/2017 | Iwabuchi | H10P 72/78 |
| 2020/0135530 | A1 * | 4/2020 | Shah | H10P 72/722 |
| 2023/0092336 | A1 * | 3/2023 | Muraki | H01L 21/3105 438/62 |

FOREIGN PATENT DOCUMENTS

| | | | |
|---|---|---|---|
| JP | 11-163103 | A | 6/1999 |
| JP | 2000-114556 | A | 4/2000 |
| JP | 2010-161319 | A | 7/2010 |

* cited by examiner

SEMICONDUCTOR MANUFACTURING APPARATUS AND METHOD OF PROCESSING OBJECT

CROSS-REFERENCE TO RELATED APPLICATION

This application is based upon and claims the benefit of priority from Japanese Patent Application No. 2021-152172, filed on Sep. 17, 2021; the entire contents of which are incorporated herein by reference.

FIELD

Embodiments relate to a semiconductor manufacturing apparatus and a method of processing an object using a semiconductor manufacturing apparatus.

BACKGROUND

In recent years, known examples of a semiconductor device include a three-dimensional memory.

DETAILED DESCRIPTION

Figure 1:
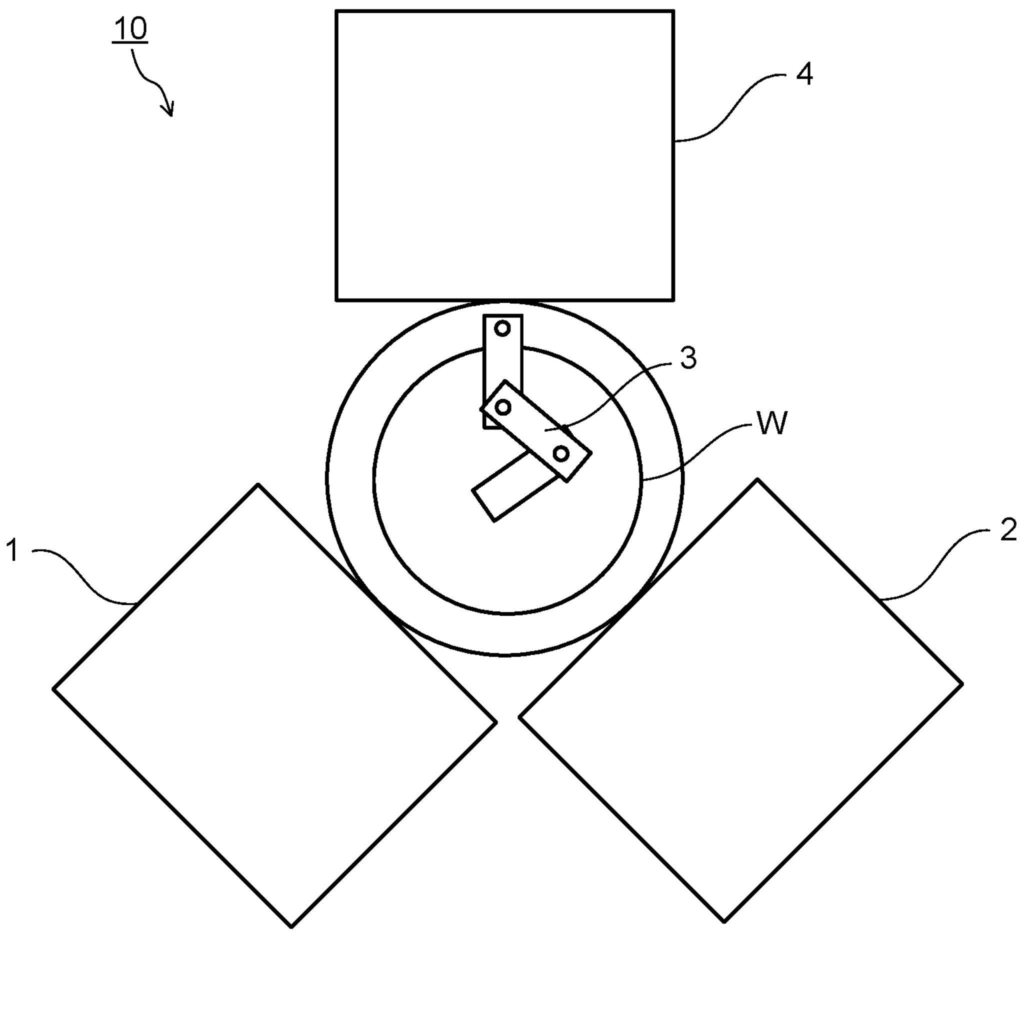
FIG. 1 is a schematic view illustrating a configuration example of a semiconductor manufacturing apparatus.

A semiconductor manufacturing apparatus in an embodiment for processing an object having a first surface and a second surface opposite to the first surface, includes: a first processor having a chuck in a first chamber, the chuck having a chuck surface configured to chuck the object, the chuck surface having protrusions adjacent to each other along one direction of the chuck surface, the protrusions being configured to be pressed against the second surface to form depressions adjacent to each other along one direction on the second surface; and a second processor configured to expose the second surface to a chemical solution in a second chamber to process the depressions into a trench, the trench extending along the one direction on the second surface.

Embodiments will be hereinafter explained with reference to the drawings. A relation between the thickness and planar dimensions of each component illustrated in the drawings, a thickness ratio among the components, and so on may be different from actual ones. Further, in the embodiments, substantially the same components are denoted by the same reference signs, and the explanation thereof will be omitted when appropriate.

Configuration Example of a Semiconductor Manufacturing Apparatus

FIG. 1 is a schematic view illustrating a configuration example of a semiconductor manufacturing apparatus. A semiconductor manufacturing apparatus 10 is a single-wafer type semiconductor manufacturing apparatus, and includes a processor 1, a processor 2, a robot 3, and a load port 4.

The processor 1 is a processing unit for forming depressions on a rear surface of an object W.

The processor 2 is a processing unit for processing the depressions on the rear surface of the object W to form trenches.

The robot 3 is arranged, for example, between the processor 1 and the processor 2, and the load port 4. The robot 3 can transfer the object W to/from each of the load port 4, the processor 1, and the processor 2, and can load/unload the object W on/from each of the load port 4, the processor 1, and the processor 2. Examples of the robot 3 include a robot arm.

The load port 4 houses the object W to be transferred from the outside. The load port 4 may house a plurality of objects W.

First Configuration Example of the Processor 1

Figure 2:
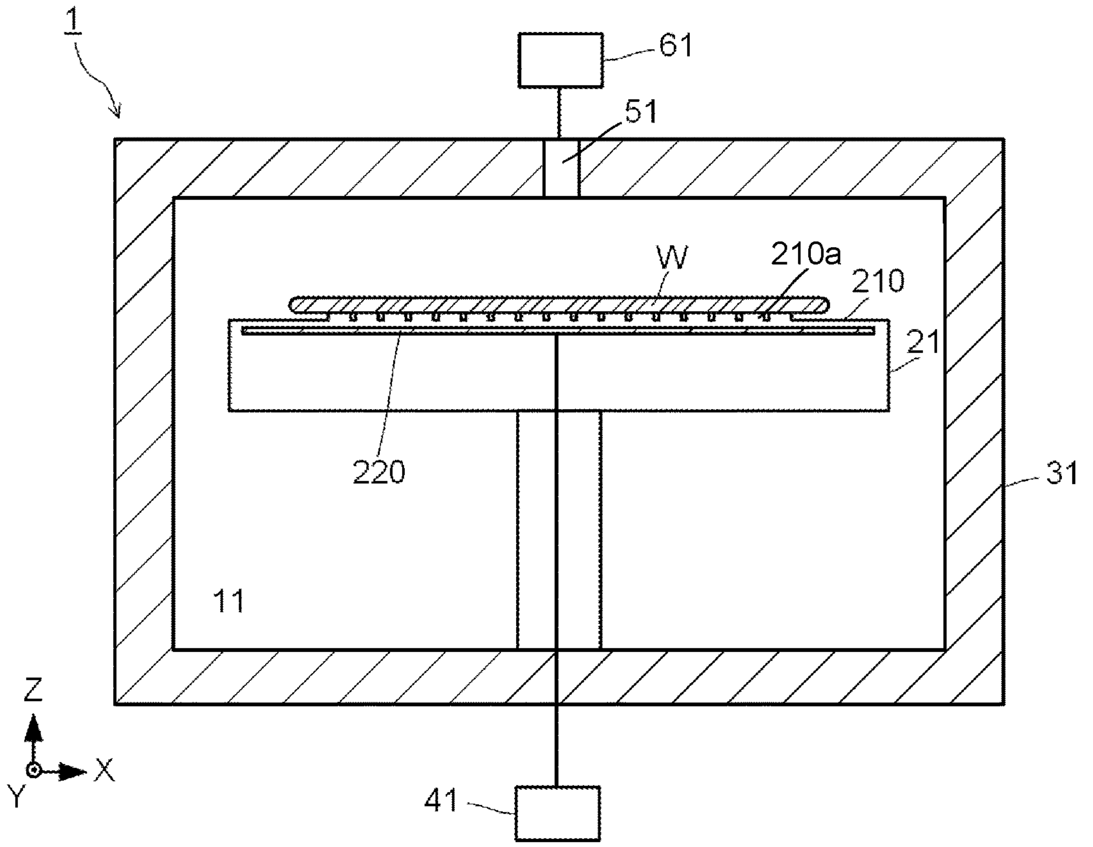
FIG. 2 is a schematic sectional view illustrating a first configuration example of a processor 1.

FIG. 2 is a schematic sectional view illustrating a first configuration example of the processor 1. The processor 1 includes a chamber 11, a stage 21, and a housing 31.

The chamber 11 has a space surrounded by the housing 31. The chamber 11 can process the rear surface of the object W to form the depressions on the rear surface of the object W. The object W has, for example, a semiconductor substrate such as a silicon wafer. The object W has a front surface (an upper surface of the object W in FIG. 2) and a rear surface (a lower surface of the object Win FIG. 2) opposite to the front surface.

The stage 21 is provided in the chamber 11. The stage 21 forms an electrostatic chuck for adsorbing the object W. The stage 21 has a chuck surface 210 and an inner electrode 220.

The chuck surface 210 is a surface for adsorbing the object W. A portion in contact with the object W can be formed of an insulating material such as a ceramic material.

The inner electrode 220 overlaps the chuck surface 210 in a Z-axis direction intersecting the front surface of the object W. The inner electrode 220 is embedded in the stage 21. The inner electrode 220 is connected to a direct-current power supply 41. The direct-current power supply 41 supplies a direct-current voltage for adsorbing, for example, the object W. The direct-current power supply 41 may have a switch and switch between start and stop of the supply of the direct-current voltage by the switch.

The housing 31 may have a gas inlet 51 and supply an inert gas such as nitrogen or argon from a gas supply source 61 via the gas inlet 51. The gas supply source 61 may have a mass flow controller connected to a gas tank, and regulate a gas flow rate by the mass flow controller. Further, the housing 31 may have a gas outlet, which is not illustrated, and exhaust gas from the chamber 11 via the gas outlet. Further, the housing 31 may have a transfer-in/out port for loading/unloading the object W.

The stage 21, the direct-current power supply 41, and the gas supply source 61 may be controlled by a controller, which does not be illustrated. The controller may be constituted using hardware using a processor or the like. Each operation may be saved as an operation program in a computer-readable storage medium such as a memory, and each operation may be executed by reading the operation program stored in the storage medium by the hardware when needed.

Figure 3:
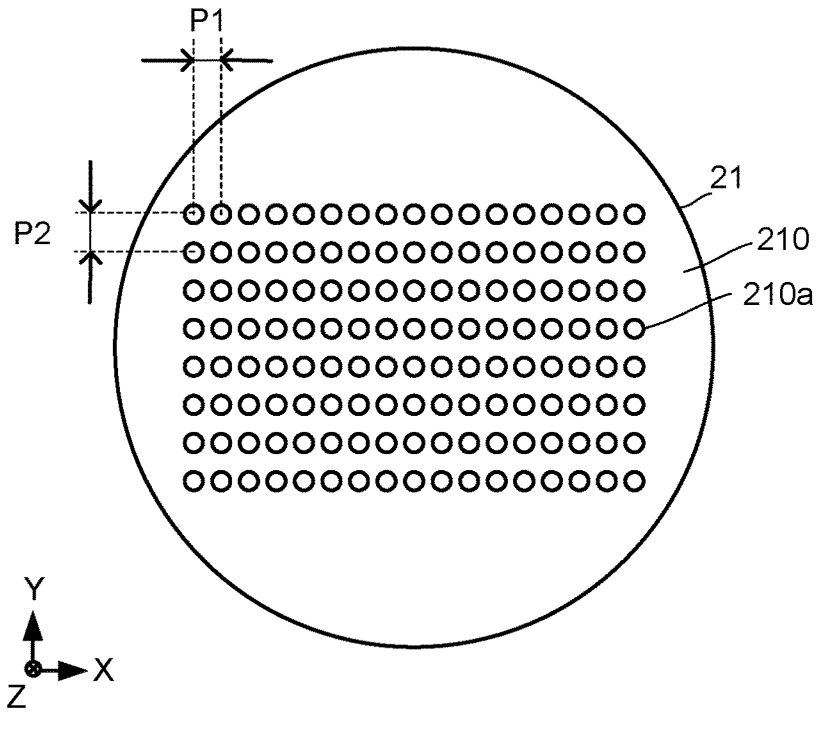
FIG. 3 is a schematic top view illustrating a structure example of a chuck surface 210.

FIG. 3 is a schematic top view illustrating a structure example of the chuck surface 210. FIG. 3 illustrates an X-Y plane parallel to the chuck surface 210. The chuck surface 210 has a protrusion 210*a*. The protrusion 210*a* has a gentle surface for coming on the object W. FIG. 3 illustrates a plurality of protrusions 210*a*. Each of the protrusions 210*a* overlaps on the inner electrode 220 in the Z-axis direction intersecting the chuck surface 210. That the number of the protrusions 210*a* is not limited to the number of protrusions 210*a* illustrated in FIG. 3.

The protrusion 210*a* is a region in contact with the object W. The protrusions 210*a* are arranged in an X-axis direction and a Y-axis direction parallel to the chuck surface 210 to form a matrix. An interval P1 between the protrusions 210*a* adjacent in the X-axis direction of the protrusions 210*a* is narrower than an interval P2 between the protrusions 210*a* adjacent in the Y-axis direction of the protrusions 210*a*. The diameter of the protrusion 210*a* is appropriately set according to the size of the depression desired to be formed. The layout of the protrusions 210*a* is not limited to the layout illustrated in FIG. 3.

Second Configuration Example of the Processor 1

Figure 4:
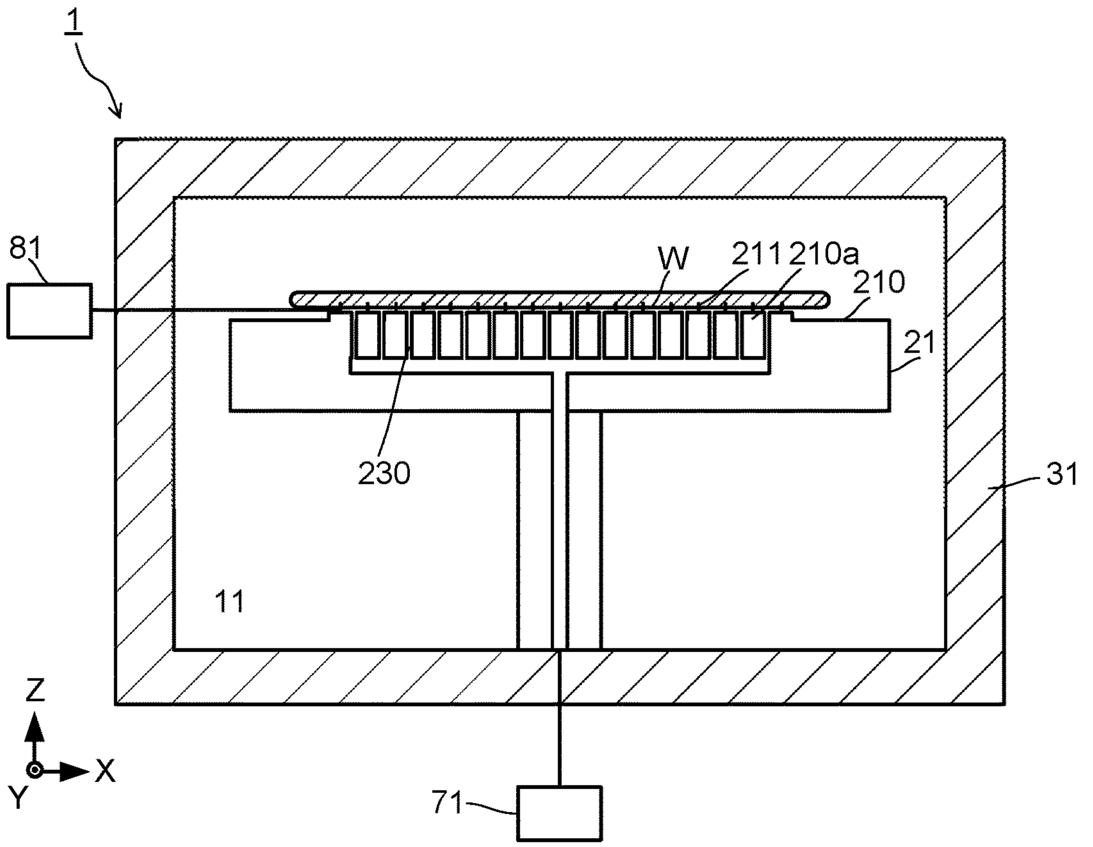
FIG. 4 is a schematic sectional view illustrating a second configuration example of the processor 1.

FIG. 4 is a schematic sectional view illustrating a second configuration example of the processor 1. The processor 1 includes a chamber 11, a stage 21, and a housing 31. The chamber 11 and the housing 31 are the same as the chamber 11 and the housing 31 in the first configuration example of the processor 1, and therefore the explanation of the first configuration example can be incorporated as needed.

The stage 21 forms a vacuum chuck for adsorbing the object W. The stage 21 has a chuck surface 210 and an opening 230.

The chuck surface 210 is a surface for adsorbing the object W. A portion in contact with the object W can formed of an insulating material such as a ceramic material.

The opening 230 faces the chuck surface 210 in a Z-axis direction intersecting the front surface of the object W. The opening 230 is provided inside the stage 21. The opening 230 is connected to a vacuum pump 71. The vacuum pump 71 evacuates, for example, the opening and thereby reduces the pressure in the opening 230 to make a vacuum state. The vacuum pump 71 may have a switch and switch between start and stop of the evacuation by the switch. Further, to make the opening 230 into a vacuum state, the object W may be fixed to the chuck surface 210 using a fixture.

The stage 21 and the vacuum pump 71 may be controlled, for example, by a not-illustrated controller. The controller may be constituted using hardware using a processor. Each operation may be saved as an operation program in a computer-readable storage medium such as a memory, and each operation may be executed by reading the operation program stored in the storage medium by the hardware when needed.

Figure 5:
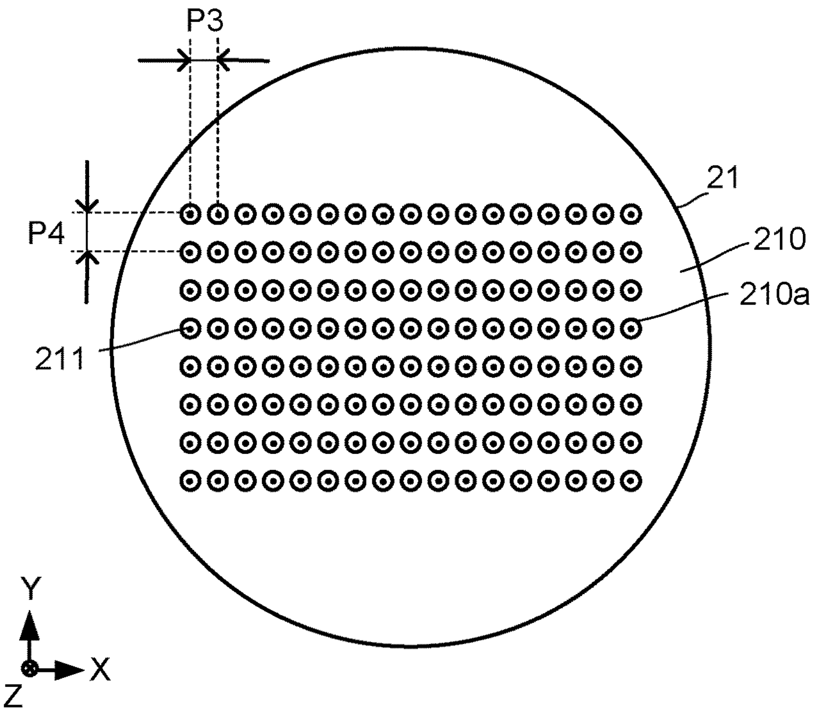
FIG. 5 is a schematic top view illustrating a structure example of the chuck surface 210.

FIG. 5 is a schematic top view illustrating a structure example of the chuck surface 210. FIG. 5 illustrates an X-Y plane parallel to the chuck surface 210. The chuck surface 210 has a protrusion 210*a*. FIG. 5 illustrates a plurality of protrusions 210*a*. Each of the protrusions 210*a* overlaps on the opening 230 in the Z-axis direction intersecting the chuck surface 210. The number of the protrusions 210*a* is not limited to the number of protrusions 210*a* illustrated in FIG. 5.

The protrusion 210*a* is a region in contact with the object W. The protrusion 210*a* has a needle 211. The needle 211 is connected to a drive mechanism 81. The drive mechanism 81 can vertically move the needle 211 along the Z-axis direction. The drive mechanism 81 may be controlled by the above controller.

The needles 211 are arranged along an X-axis direction and a Y-axis direction to form a matrix. An interval P3 between the needles 211 adjacent in the X-axis direction of the needles 211 is narrower than an interval P4 between the needles 211 adjacent in the Y-axis direction of the needles 211. The interval P3 and the interval P4 are center distances between the adjacent needles 211. The diameter of the needle 211 is appropriately set according to the size of the depression desired to be formed. The layout of the protrusions 210*a* and the needles 211 is not limited to the layout illustrated in FIG. 5.

Configuration Example of the Processor 2

Figure 6:
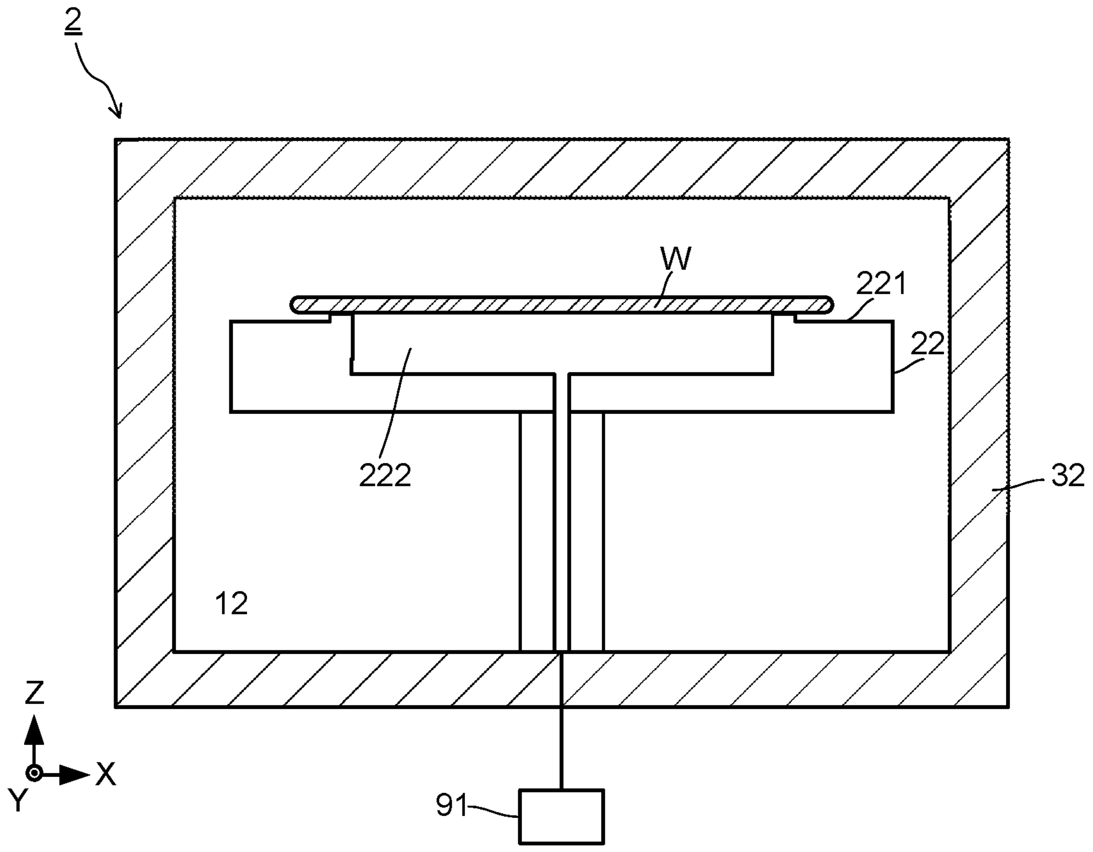
FIG. 6 is a schematic sectional view illustrating a configuration example of a processor 2.

FIG. 6 is a schematic sectional view illustrating a configuration example of the processor 2. The processor 2 includes a chamber 12, a stage 22, and a housing 32.

The chamber 12 is a space surrounded by the housing 32. In the chamber 12, processing of exposing the rear surface of the object W to a chemical solution.

The stage 22 is provided in the chamber 12. The stage 22 has a mounting surface 221 and an opening 222.

The mounting surface 221 is a surface for holding the object W. The mounting surface 221 may have a protrusion in contact with the rear surface of the object W.

The opening 222 is surrounded by the mounting surface 221 in an X-Y plane. The opening 222 is a region facing the rear surface of the object W. The opening 222 is connected to a chemical solution supply source 91 via the housing 32. The chemical solution supply source 91 supplies a chemical solution. The chemical solution supply source 91 may have a mass flow controller connected to a chemical solution tank, and the flow rate of the chemical solution may be regulated by the mass flow controller. The object W is preferably mounted on the protrusions on the mounting surface 221 in a manner that the chemical solution is not in contact with the front surface of the object W. An example of the chemical solution can be an alkaline solution. The stage 22 has a chemical solution discharge flow path, which is not illustrated and the connection of the opening 222 and the chemical solution discharge flow path using a valve and so on can selectively discharge the chemical solution from the opening 222. Besides, the object W may be fixed to the mounting surface 221 using a fixture.

Method Example of Processing the Object W

Figure 7:
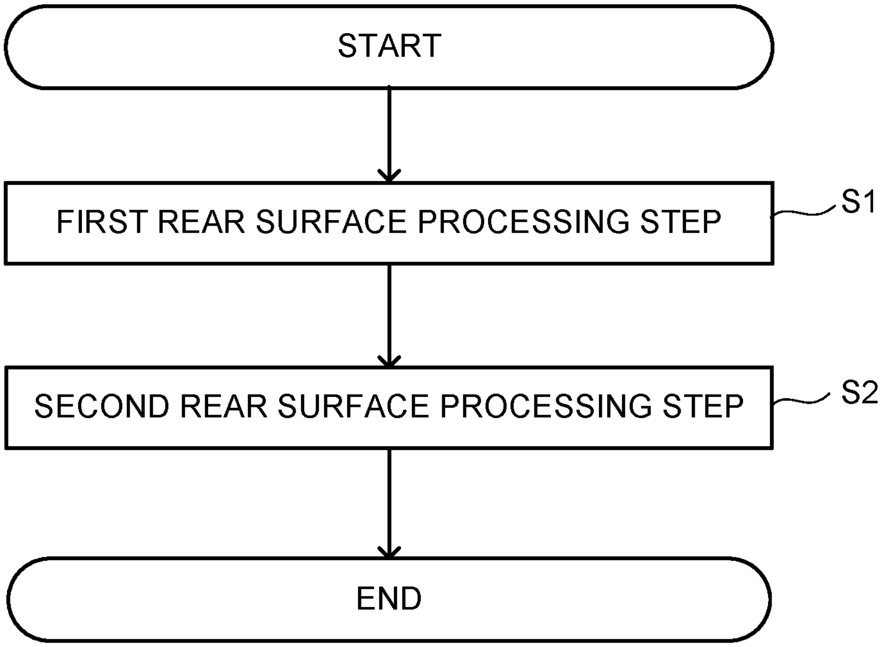
FIG. 7 is a flowchart for explaining an method example of processing an object W using a semiconductor manufacturing apparatus 10.

FIG. 7 is a flowchart for explaining a method example of processing the object W using the semiconductor manufacturing apparatus 10. The method example of processing the object W includes a first rear surface processing step S1 and a second rear surface processing step S2 as illustrated in FIG. 7.

First Example of the First Rear Surface Processing Step S1

Figure 8:
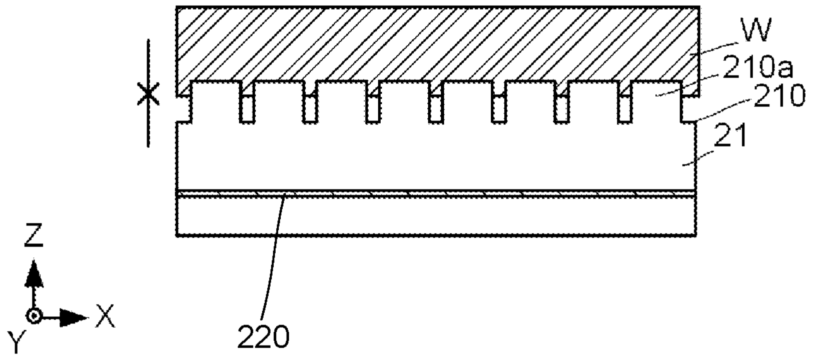
FIG. 8 is a schematic view for explaining a first example of a first rear surface processing step S1.

FIG. 8 is a schematic view for explaining a first example of the first rear surface processing step S1. In the case where the processor 1 has the first configuration example, a prepared object W is mounted on the stage 21 of the processor 1 using the robot 3 by the first example of the first rear surface processing step S1. The rear surface of the object W comes on the protrusions 210*a*. FIG. 8 is a schematic sectional view illustrating parts of the object W and the stage 21 in the first example of the first rear surface processing step S1.

Next, the direct-current power supply 41 illustrated in FIG. 2 is used to apply voltage to the inner electrode 220. When applying the direct-current voltage to the inner electrode 220, positive charge and negative charge attract each other between the stage 21 and the object W to generate adsorption force. This adsorption force is caused, for example, by Johnsen-Rahbeck force (J-R force) generated in a space between the stage 21 and the object W or Coulomb force generated between the chuck surface 210 and the object W.

The protrusions 210*a* are pressed against the rear surface of the object W as illustrated in FIG. 8 by adjusting the adsorption force. Thus, the depressions corresponding to the protrusions 210*a* can be formed on the rear surface of the object W.

Second Example of the First Rear Surface Processing Step S1

Figure 9:
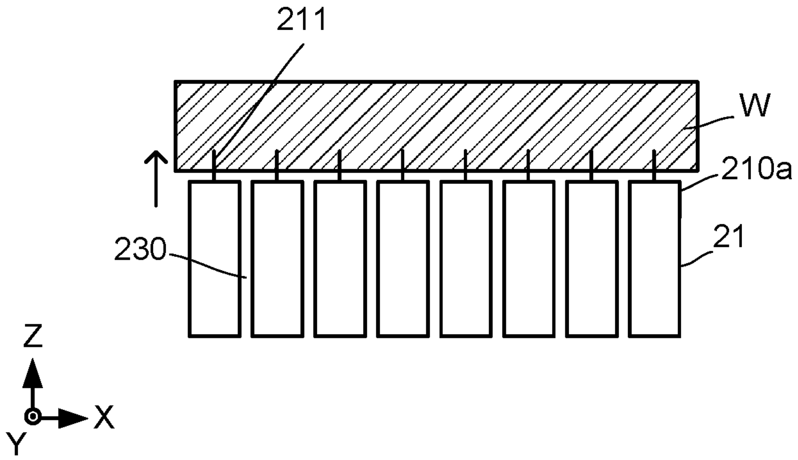
FIG. 9 is a schematic view for explaining a second example of the first rear surface processing step S1.

FIG. 9 is a schematic view for explaining a second example of the first rear surface processing step S1. In the case where the processor 1 has the second configuration example, a prepared object W is mounted on the stage 21 of the processor 1 using the robot 3 by the second example of the first rear surface processing step S1. The rear surface of the object W comes on the protrusions 210*a*. FIG. 9 is a schematic sectional view illustrating parts of the object W and the stage 21 in the second example of the first rear surface processing step S1.

Next, the vacuum pump 71 illustrated in FIG. 4 is used to make the inside of the opening 230 into a vacuum state. When making the inside of the opening 230 into a vacuum state by reducing the pressure, the object W is drawn to the stage 21 to cause adsorption force.

Further, while keeping the object W adsorbed on the chuck surface 210 of the stage 21, the needles 211 are driven by using the drive mechanism 81 illustrated in FIG. 4. The needles 211 are pressed against the rear surface of the object W as illustrated in FIG. 9. Thus, the depressions can be formed on the rear surface of the object W. Note that the protrusions 210*a* may be in contact with the rear surface of the object W when the needles 211 are pressed against the rear surface of the object W.

Figure 10:
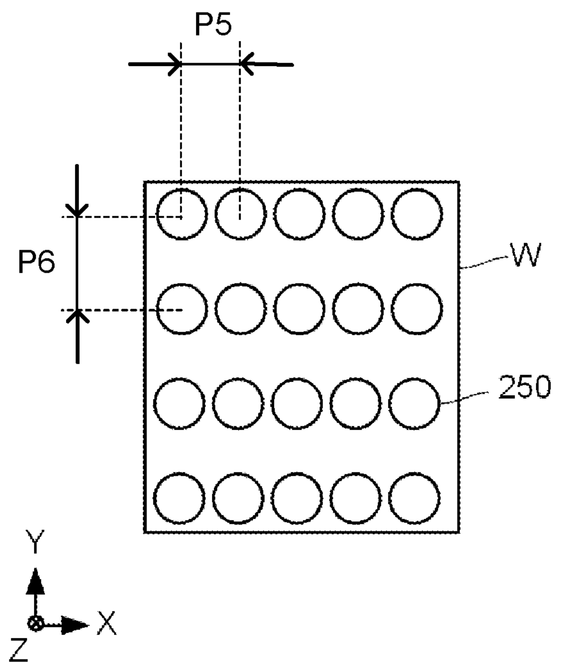
FIG. 10 is a schematic view illustrating an example of depressions formed on a rear surface of the object W by the first rear surface processing step S1.
Figure 11:
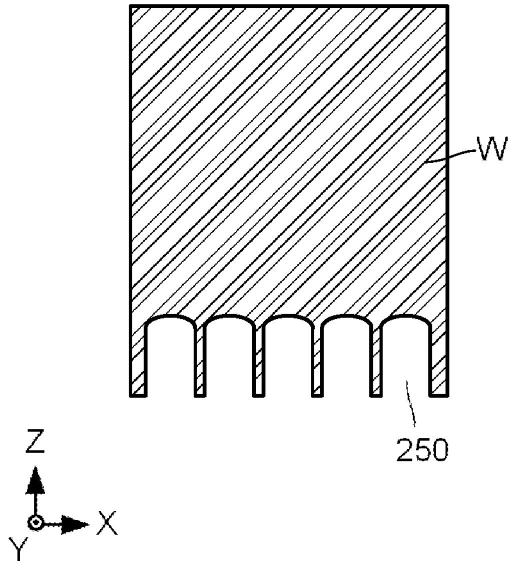
FIG. 11 is a schematic view illustrating the example of the depressions formed on the rear surface of the object W by the first rear surface processing step S1.

FIG. 10 and FIG. 11 are schematic views illustrating examples of the depressions formed on the rear surface of the object W by the first rear surface processing step S1. FIG. 10 is a schematic view illustrating a part of the upper surface of the rear surface of the object W. FIG. 11 is a schematic view illustrating a part of the section of the object W.

The rear surface of the object W has a depression 250. FIG. 10 and FIG. 11 illustrate a depressions 250. The depressions 250 are arranged in an X-axis direction and a Y-axis direction to form a matrix. An interval P5 between the depressions 250 adjacent in the X-axis direction of the depressions 250 is narrower than an interval P6 between the depressions 250 adjacent in the Y-axis direction of the depressions 250. The dimension of the depression 250 is decided according to the dimension of the protrusion 210*a* or the needle 211.

Second Rear Surface Processing Step S2

The second rear surface processing step S2 includes supplying the chemical solution from the chemical solution supply source 91 illustrated in FIG. 6 into the opening 222 to expose the rear surface of the object W to the chemical solution. This can infiltrate the chemical solution into the depressions 250 to etch the rear surface. Regions between the depressions 250 adjacent in the X-axis direction are removed by etching, so that the depressions 250 are connected to form trenches 251.

Figure 12:
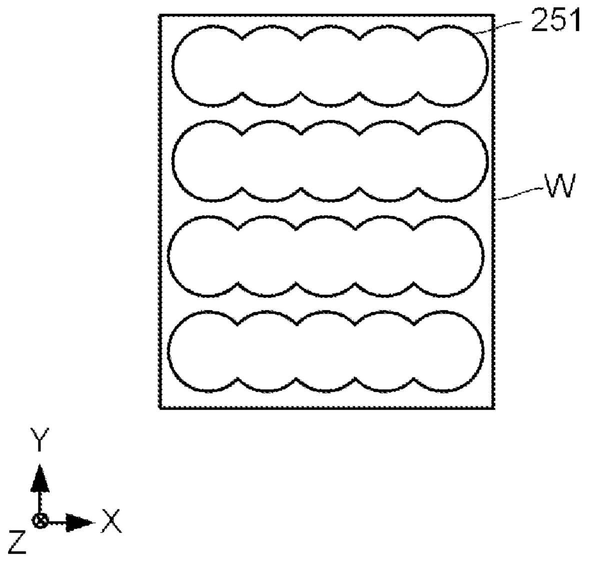
FIG. 12 is a schematic view illustrating an example of trenches formed on the rear surface of the object W by a second rear surface processing step S2.
Figure 13:
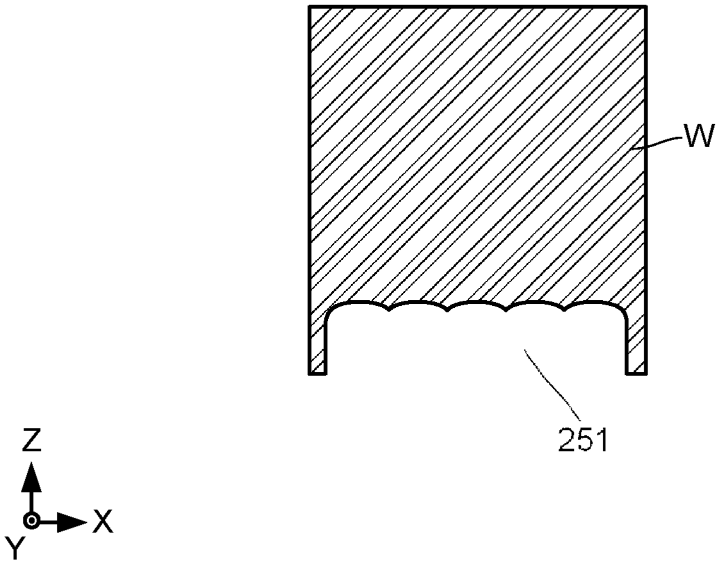
FIG. 13 is a schematic view illustrating the example of the trench formed on the rear surface of the object W by the second rear surface processing step S2.

FIG. 12 and FIG. 13 are schematic views illustrating an example of the trench formed on the rear surface of the object W by the second rear surface processing step S2. FIG. 12 is a schematic view illustrating a part of the upper surface of the rear surface of the object W. FIG. 13 is a schematic view illustrating a part of the section of the object W.

The rear surface of the object W has the trench 251 extending in the X-axis direction. FIG. 12 and FIG. 13 illustrate a plurality of trenches 251. The trenches 251 are arranged along the Y-axis direction.

As in the above, the protrusions are pressed against the rear surface of the object W to form the depressions adjacent to each other along one direction in the processor 1, and the rear surface of the object W is exposed to the chemical solution to process the depressions in the processor 2, thereby making it possible to form the trench extending in one direction in this embodiment.

Figure 14:
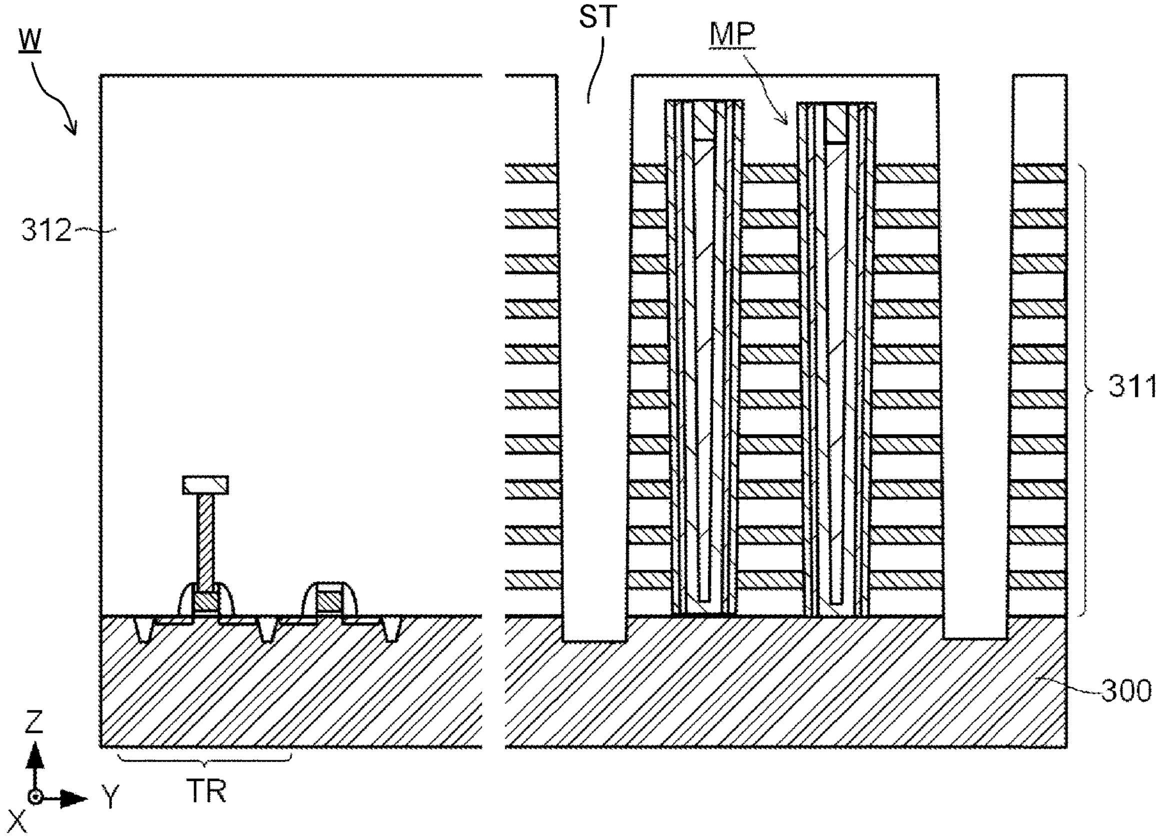
FIG. 14 is a schematic sectional view illustrating an example of the object W.

An example of the object W is explained here. FIG. 14 is a schematic sectional view illustrating an example of the object W. The example of the object W is a structure formed in the middle of manufacturing a three-dimensional memory.

The object W includes a substrate 300 having a front surface and a rear surface, and a transistor TR, a stack 311, a memory pillar MP, and an interlayer insulating film 312 which are provided on the front surface side of the substrate 300. In this case, the rear surface of the object W is the rear surface of the substrate 300. In FIG. 14, the illustration of a region between a region having the transistor TR and a region having the memory pillar MP is omitted for convenience.

Examples of the substrate 300 include a semiconductor substrate such as a silicon wafer.

The transistor TR is an N-channel field-effect transistor or a P-channel field-effect transistor. FIG. 14 illustrates two transistors TR, but the number of the transistors TR is not limited to the number of transistors TR illustrated in FIG. 14.

The transistors TR form, for example, peripheral circuits of the semiconductor memory device. The transistors TR are electrically isolated from each other by an element isolator such as Shallow Trench Isolation (STI). The transistors TR are connected to a memory cell array of the semiconductor memory device via a plug and multilayer interconnection.

The stack 311 is provided above the front surface of the substrate 300. The stack 311 has a plurality of insulating layers and a plurality of conductive layers, and each of the insulating layers and each of the conductive layers are alternately stacked in the Z-axis direction. The Z-axis direction is, for example, a thickness direction of the substrate 300. The conductive layers form, for example, word lines of the memory cell array.

The interlayer insulating film 312 covers the transistor TR, the stack 311, and the memory pillar MP.

The memory pillar MP extends through the stack 311 in the Z-axis direction as illustrated in FIG. 14. FIG. 14 illustrates two memory pillars MP, but the number of a plurality of memory pillars MP is not limited to the number of memory pillars MP illustrated in FIG. 14. The stack 311 and the memory pillars MP form a memory cell array of the semiconductor memory device. Note that the memory cell array including the memory pillar MP may be superimposed on the peripheral circuits including the transistors TR in the Z-axis direction in FIG. 14.

The memory pillars MP are separated into a plurality of groups by a slit ST. The slit ST penetrates the stack 311 in the Z-axis direction and extends down to the substrate 300.

Figure 15:
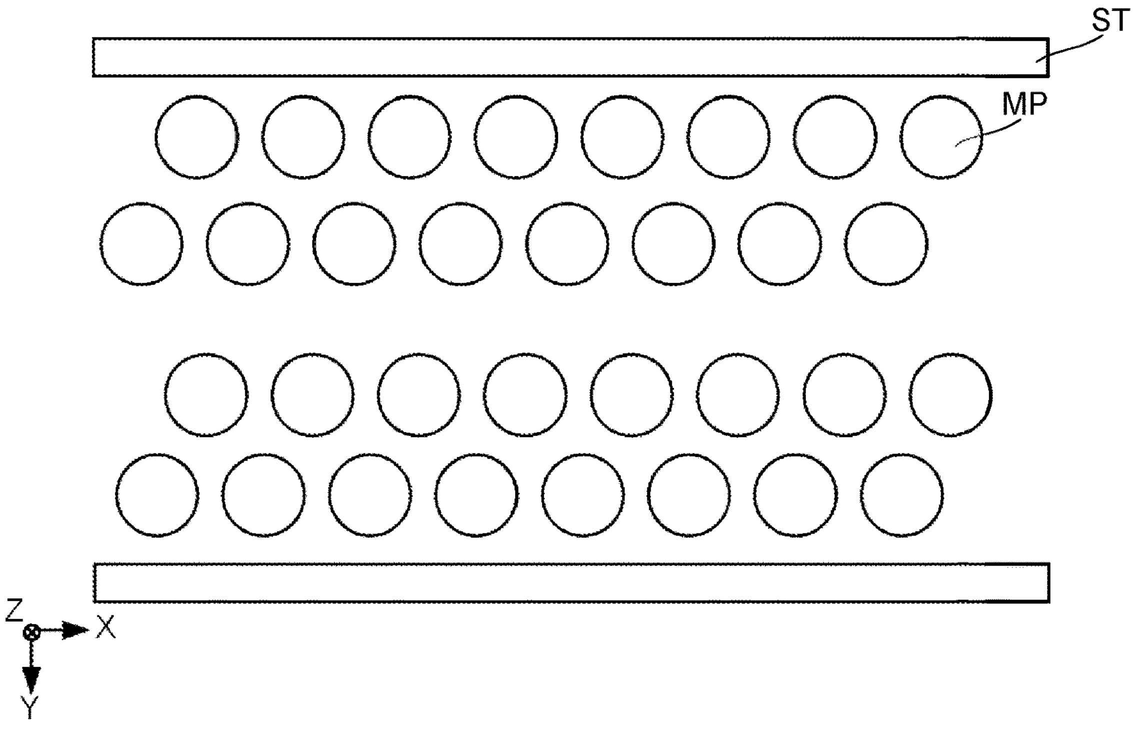
FIG. 15 is a schematic top view illustrating a layout example of a slit ST.

FIG. 15 is a schematic top view illustrating a layout example of the slit ST. FIG. 15 illustrates a plurality of slits ST. The slits ST extend in the X-axis direction.

Figure 16:
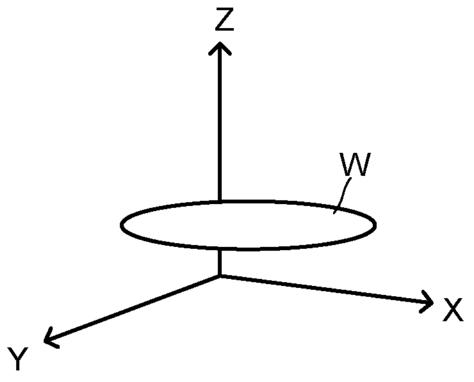
FIG. 16 is a schematic view for explaining the warpage of the object W.
Figure 17:
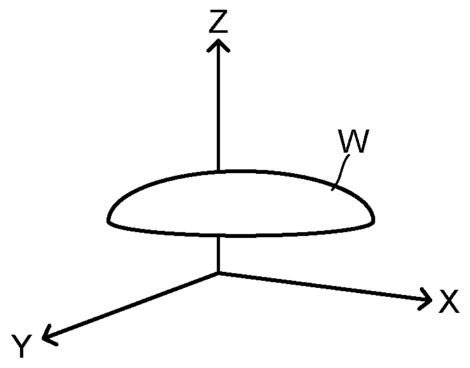
FIG. 17 is a schematic view for explaining the warpage of the object W.
Figure 18:
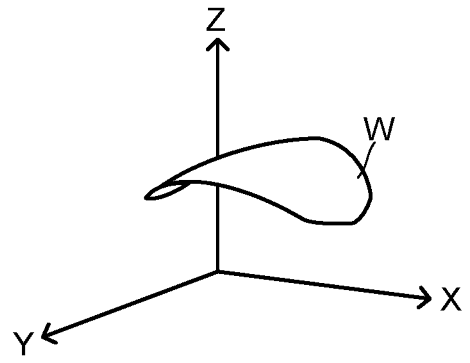
FIG. 18 is a schematic view for explaining the warpage of the object W.

FIG. 16 to FIG. 18 are schematic views for explaining the warpage of the object W. FIG. 16 to FIG. 18 illustrate the magnitudes of the warpage of the object W in the X-axis direction, the Y-axis direction, and the Z-axis direction. FIG. 15 illustrates a state without warpage of the object W. When the number of layers formed on the front surface increases in the object W, the warpage becomes larger. In contrast to this, when a film such as a silicon oxide film is formed on the rear surface of the substrate 300, the warpage of the object W in the X-axis direction and the Y-axis direction can be prevented as illustrated in FIG. 17. However, in the case of forming a plurality of slits ST having a high aspect ratio and extending in one direction accompanying the increase in the number of layers, the difference in the warpage in the X-axis direction and the warpage in the Y-axis direction becomes large, so that the warpage becomes larger along the one direction as illustrated in FIG. 18, and therefore it is difficult to sufficiently prevent the warpage in one direction even in the case of forming the film on the rear surface of the object W.

In contrast to the above, for example, the trench extending in the same direction as the extending direction of the slits ST are formed on the rear surface of the object W as in this embodiment, thereby making it possible to sufficiently prevent the warpage even when the warpage in one direction is large. To sufficiently prevent the warpage in one direction, it is preferable to make the surface area of the front surface and the surface area of the rear surface of the object W the same as much as possible.

Further, in this embodiment, depressions are formed on the rear surface of the object W using the chuck and then the depressions are processed to form trenches. This can process the rear surface without contact with the front surface (an element formation surface) of the object W. This can prevent adhesion of dust and contamination to the element formation surface and prevent the deformation of the element structure.

Modification Example of the Object W

Figure 19:
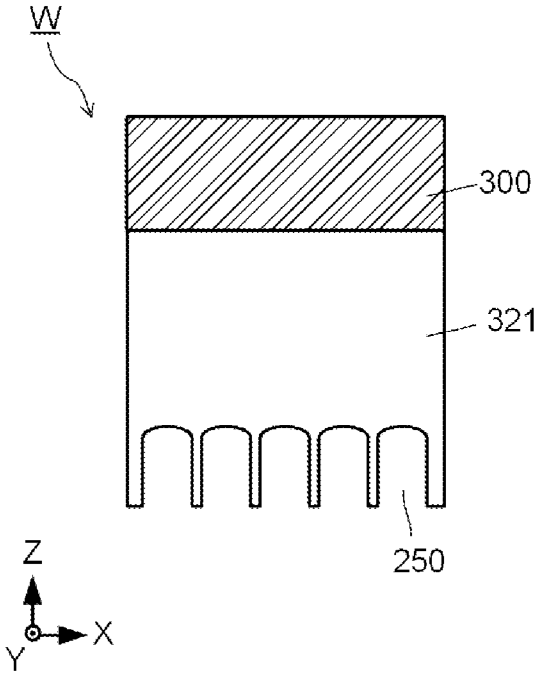
FIG. 19 is a schematic sectional view illustrating a modification example of the object W.
Figure 20:
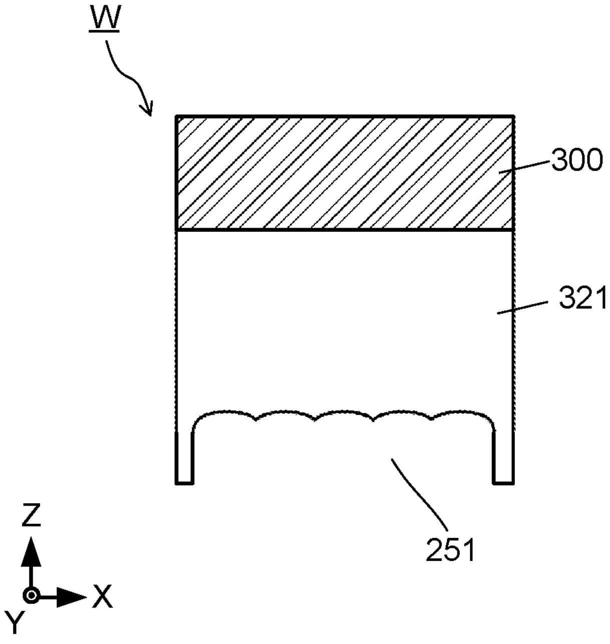
FIG. 20 is a schematic sectional view illustrating the modification example of the object W.

FIG. 19 and FIG. 20 are schematic sectional views illustrating a modification example of the object W. As illustrated in FIG. 19, a depressions 250 may be formed on the rear surface of the object W having a film 321 on the rear surface of the substrate 300 by the first rear surface processing step S1, and then the depressions may be processed by the second rear surface processing step S2 to form trenches 251. In the case of having the film 321, the rear surface of the object W is the front surface of the film 321 on the side opposite to the substrate 300.

Examples of the film 321 include a silicon oxide film and the like. The formation of the film 321 can protect the substrate 300. Note that in the case of processing the depressions 250 of the silicon oxide film, a chemical solution such as hydrogen fluoride may be used. Further, the first rear surface processing step S1 and the second rear surface processing step S2 may be performed before the elements such as the peripheral circuits and the memory cell array are formed on the front surface side of the substrate 300.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

What is claimed is:

1. A semiconductor manufacturing apparatus for processing an object having a first surface and a second surface opposite to the first surface, the apparatus comprising:

a first processor comprising a chuck in a first chamber, the chuck having a chuck surface configured to chuck the object, the chuck surface having protrusions adjacent to each other along a first direction and a second direction of the chuck surface, the second direction intersecting the first direction, the protrusions being arranged in a rectangular matrix with rows along the first direction and columns along the second direction, the protrusions being configured to be pressed against the second surface to form depressions adjacent to each other along the first direction and the second direction on the second surface; and a second processor configured to expose the second surface to a chemical solution in a second chamber to process the depressions into a trench, the trench extending along the first direction on the second surface, wherein an interval between protrusions adjacent in the first direction of the protrusions is narrower than an interval between protrusions adjacent in the second direction, and the second processor is configured to allow the chemical solution to infiltrate into the depressions and chemically etch regions between the depressions in the first direction on the second surface so as to remove the regions and thereby connect the depressions in the first direction to form the trench.

2. The apparatus according to claim 1, wherein:

the chuck is an electrostatic chuck; and each of the protrusions has a gentle surface configured to be pressed against the second surface.

3. The apparatus according to claim 2, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

4. The apparatus according to claim 1, wherein:

the chuck is a vacuum chuck; and each of the protrusions has a needle configured to be pressed against the second surface.

5. The apparatus according to claim 4, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

6. The apparatus according to claim 1, wherein the object includes a semiconductor substrate having the second surface.

7. The apparatus according to claim 6, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

8. The apparatus according to claim 1, wherein the object includes:

a semiconductor substrate; and a film above the semiconductor substrate, the film having the second surface.

9. The apparatus according to claim 8, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

10. The apparatus according to claim 1, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

11. The apparatus according to claim 1, wherein the first direction is perpendicular to the second direction.

12. A semiconductor manufacturing apparatus for processing an object having a first surface and a second surface opposite to the first surface, the apparatus comprising:

a first processor including a first housing, a first chamber surrounded by the first housing, and a first stage including a chuck in the first chamber, the chuck having a chuck surface configured to chuck the object, the chuck surface having protrusions adjacent to each other along a first direction and a second direction of the chuck surface, the second direction intersecting the first direction, the protrusions being arranged in a rectangular matrix with rows along the first direction and columns along the second direction, the protrusions being configured to be pressed against the second surface to form depressions adjacent to each other along the first direction and the second direction on the second surface;

a second processor including a second housing, a second chamber surrounded by the second housing, and a second stage including a mounting surface for holding the object and an opening, configured to expose the second surface to a chemical solution in a second chamber to process the depressions into a trench, the trench extending along the first direction on the second surface;

a load port configured to house the object to be transferred from the outside; and a robot arranged between the first processor and the second processor, between the first processor and the load port, and between the second processor and the load port, and configured to transfer the object to and from each of the load port, the first processor, and the second processor, and load and unload the object on and from each of the load port, the first processor, and the second processor, wherein the mounting surface includes a protrusion in contact with the second surface of the object, the opening facing the second surface of the object and configured to supply chemical solution to the second surface of the object, an interval between protrusions adjacent in the first direction of the protrusions is narrower than an interval between protrusions adjacent in the second direction, and the second processor is configured to allow the chemical solution to infiltrate into the depressions and chemically etch regions between the depressions in the first direction on the second surface so as to remove the regions and thereby connect the depressions in the first direction to form the trench.

13. The apparatus according to claim 12, wherein:

the chuck is an electrostatic chuck; and each of the protrusions has a gentle surface configured to be pressed against the second surface.

14. The apparatus according to claim 12, wherein:

the chuck is a vacuum chuck; and each of the protrusions has a needle configured to be pressed against the second surface.

15. The apparatus according to claim 12, wherein:

the depressions are arranged along the first direction of the chuck surface and arranged along the second direction of the chuck surface, to form a matrix; and an interval between depressions adjacent in the first direction of the depressions is narrower than an interval between depressions adjacent in the second direction of the depressions.

16. The apparatus according to claim 12, wherein the first direction is perpendicular to the second direction.

* * * * *